United States Patent [19]
Offenberg

[11] Patent Number: 5,683,591
[45] Date of Patent: Nov. 4, 1997

[54] PROCESS FOR PRODUCING SURFACE MICROMECHANICAL STRUCTURES

[75] Inventor: Michael Offenberg, Tübingen, Germany

[73] Assignee: Robert Bosch GmbH, Stuttgart, Germany

[21] Appl. No.: 553,571

[22] PCT Filed: May 11, 1994

[86] PCT No.: PCT/DE94/00538

§ 371 Date: Nov. 27, 1995

§ 102(e) Date: Nov. 27, 1995

[87] PCT Pub. No.: WO94/28426

PCT Pub. Date: Dec. 8, 1994

[30] Foreign Application Priority Data

May 25, 1993 [DE] Germany .................. 43 17 274.1

[51] Int. Cl.$^6$ .................. B44C 1/22; H01L 21/00
[52] U.S. Cl. .................. 216/2; 156/626.1; 156/646.1; 216/59; 216/79
[58] Field of Search .................. 156/626.1, 628.1, 156/643.1, 646.1, 653.1, 657.1; 216/2, 58, 59, 62, 79; 437/228 H, 927

[56] References Cited

U.S. PATENT DOCUMENTS

| | | | |
|---|---|---|---|
| 4,849,071 | 7/1989 | Evans et al. | 437/927 X |
| 5,174,855 | 12/1992 | Tanaka | 156/345 V |
| 5,470,797 | 11/1995 | Mastrangelo | 437/927 X |

FOREIGN PATENT DOCUMENTS 0 456 029  11/1991  European Pat. Off. .

OTHER PUBLICATIONS

Lober and Howe; IEEE 1988—Surface–Micromachining Processes for Electrostatic Microactuator Fabrication; pp. 59–62.

Mastrangelo and Saloka; IEEE 1993—A Dry–Release Method Based Onpolymer Columns for Microstructure Fabrication; pp. 77–81.

*Primary Examiner*—William Powell
*Attorney, Agent, or Firm*—Kenyon & Kenyon

[57] ABSTRACT

A method for fabricating surface-micromechanical structures wherein a sacrificial layer, in particular of silicon oxide, is deposited on a silicon substrate represented by a silicon wafer, the sacrificial layer being patterned. Onto the sacrificial layer, a second layer, in particular of polysilicon, is deposited and is likewise patterned. The sacrificial layer is removed in an etching operation by means of an etching medium which attacks the sacrificial layer but not the second layer, structures being formed as a result of which are free-standing above the silicon substrate at a distance equal to the thickness of the removed sacrificial layer and are anchored at certain sites on the silicon substrate. According to the invention, for the purpose of etching and exposing, the micromechanical structures are exposed to the vapor phase of a mixture of anhydrous hydrofluoric acid and water in a vapor-phase etching process. This makes it possible to dispense with laborious rinsing operations and sublimation operations.

12 Claims, 2 Drawing Sheets

PROCESS FOR PRODUCING SURFACE MICROMECHANICAL STRUCTURES

FIELD OF THE INVENTION

The present invention relates to a method for fabricating surface-micromechanical structures.

BACKGROUND INFORMATION

PCT International Application Ser. No. WO 92/03740 discloses a method for fabricating surface-micromechanical structures, which involves depositing, on a silicon substrate represented by a silicon wafer, a sacrificial layer of silicon oxide and patterning the layer in such a way that, inter alia, windows toward the silicon substrate are created as subsequent anchoring sites for free structures. Onto the sacrificial layer, a second layer of polysilicon is deposited and is likewise patterned in accordance with the lateral demarcations of the subsequent free structures.

Then, with the aid of aqueous hydrofluoric acid solution as an etching solution which has a high selectivity with respect to polycrystalline silicon and therefore with respect to the second layer, the sacrificial layer is removed. As a result, structures are formed which are free-standing above the silicon substrate at a distance equal to the thickness of the removed sacrificial layer and are anchored on the silicon substrate at the previously patterned window sites of the sacrificial layer.

After etching, the silicon wafer is rinsed, the rinse liquid then having to be removed again from the wafer and the micromechanical structures. A customarily employed drying procedure such as spinning or heating is not possible in this case, however, since the withdrawing liquids, owing to their surface tension, would exert forces on the microstructures exposed by etching. As a result, the flexible, exposed microstructures would be deformed, would come to lie against the silicon substrate and thus irreversibly adhere to the substrate surface. It is therefore known to replace the rinse liquid by a liquid which can be converted into the solid phase either by freezing (e.g. cyclohexane) or by solvent removal (photoresist/acetone mixture). Then, by means of sublimation or by chemical reaction, e.g. by the known photoresist/acetone ashing process, the transition from the solid into the gaseous state is effected, during which transition the forces due to surface tensions are minimal and as a result the micromechanical structures remain free.

SUMMARY OF THE INVENTION

The fabrication method according to the present invention does not, for the purpose of etching and exposing the micromechanical structures, involve dipping of the silicon wafer into an etching fluid nor does it, as a result, require laborious drying. Instead, the silicon wafer is exposed to the vapor phase of a mixture of anhydrous hydrofluoric acid and water in a vapor-phase etching process, suitable measures being required, e.g. heating of the wafer, to ensure that no condensate is formed on the wafer surface, which would cause the emerging micromechanical structures to adhere. While water is a product in the etching reaction, it is also a necessary initiator, since the removal of silicon oxide involves a reaction, via intermediate steps, according to the reaction equation:

$$SiO_2 + 4HF \rightarrow SiF_4 + 4H_2O$$

This provides the advantage of being able, by adjusting the water content on the wafer surface, to control the reaction rate and check the etching operation. It is not only the water originating from the vapor phase, but also the amount of the water absorbed during etching or adsorbed prior to etching, which affects the etching rate. Short etching times of only a few hours are possible, and after a vapor-phase etching process, the micromechanical structures are free and dry. Time-consuming sublimation operations and rinsing taking up to several days, which typically arise in the traditional procedure, are unnecessary. Owing to the small forces acting on the structures during vapor-phase etching, even highly sensitive structures can be achieved. Vapor-phase etching can be carried out at various points of IC fabrication and thus facilitates the use of standard techniques and integrability of evaluation electronics. Moreover, the method can be implemented by simple means and be extended to existing processes.

Further enhancements are possible to the method according to the present invention. In particular, a sacrificial layer of undoped silicon oxide can advantageously be removed directly by means of vapor-phase etching. Moreover, mechanical reinforcements between the silicon substrate and the structures to be exposed by etching are possible, which are not removed until the end of the process. Alternatively, sacrificial layers of doped silicon oxide can be removed with liquid etching solution, using a first conventional etching operation, and a rinse liquid can be removed by spinning, reinforcements being removed subsequently by a second etching operation using the dry vapor-phase etching process. To protect the micromechanical structures, in particular during the cutting-up operation, encapsulated arrangements can likewise be implemented in a simple manner. The removal of the sacrificial layer by means of vapor-phase etching does not require any process steps at the wafer level and can also be carried out after cutting up at the chip level. With an azeotropic concentration of the hydrofluoric acid of 38.26%, the ratio hydrofluoric acid/water in the liquid phase corresponds to that in the gas phase, so that constant etching conditions over time are obtained.

A particular advantage derives from the possibility of carrying out an in situ etching rate check, with the aid of a test structure and a capacitance measurement, since in this case the etching medium is electrically nonconductive.

DETAILED DESCRIPTION OF THE DRAWINGS

Figure 1:
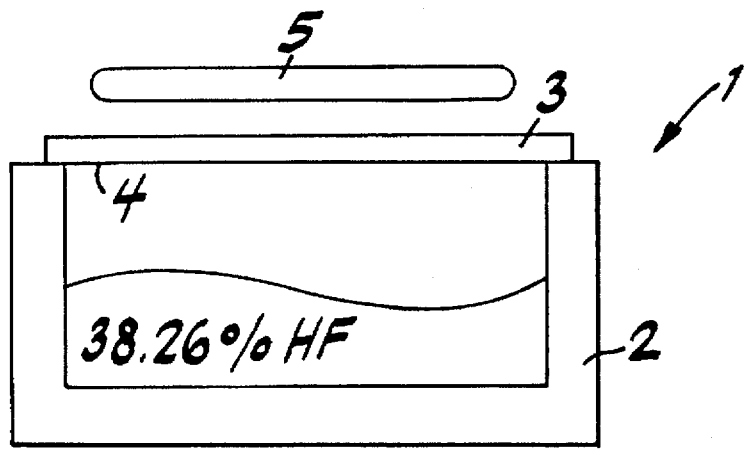
FIG. 1 shows a cross-section of a vessel partially filled with hydrofluoric acid and water and covered by a silicon wafer, according to the present invention.

FIG. 1 depicts an arrangement 1 relating to a vapor-phase etching process and comprising a vessel 2 which contains a hydrofluoric acid solution HF having an azeotropic concentration of 38.26%. At the top the vessel is fitted tightly with a silicon wafer 3, so that the surface 4, on which micromechanical structures are being fabricated, faces the interior of the vessel and is thus exposed to the vapor phase comprising anhydrous hydrofluoric acid and water. The silicon wafer 3 can comprise for example a multiplicity of silicon substrates.

Above the wafer 3, a sheet-type heater 5 is arranged to heat the wafer. In addition to heating, condensation of a water film can also be prevented by pumping.

The structure of the silicon wafer 3 prior to vapor-phase etching in the arrangement according to FIG. 1 is such that a sacrificial layer of silicon oxide, with windows for subsequent anchorages of the structure elements, is deposited on a silicon substrate. Deposited on the sacrificial layer there is a second layer of polysilicon, which is patterned in accordance with the lateral demarcations of the structure elements.

In the arrangement according to FIG. 1, the sacrificial layer is removed in a dry process by vapor-phase etching, so that free-standing structure elements are standing free above the substrate at a distance equal to the thickness of the sacrificial layer.

Via controlled heating of the silicon wafer 3 by means of the heating element 5, the water content at the wafer surface 4 is adjusted, and the etching rate can thus be controlled. In the case of an undoped sacrificial layer of silicon oxide, this arrangement and this method allows the sacrificial layer to be removed directly, while only minimal forces acting on the exposed structures will arise.

Since the implementation of surface-micromechanical structures and sensors often also involves the integration of electronic circuits, particularly of the evaluation circuit type, these must be protected from the etching medium by a suitable IC-compatible protective film. In the case of conventional etching processes in liquid etching media, photoresists show a tendency to swell and to peel off after only a short time, long before the etching operation is complete, so that the protective effect is lost. In the case of the present vapor-phase etching process, on the other hand, ordinary positive resist exhibits very good resistance to the etching medium and thus represents effective protection for integrated circuits during the entire etching operation. After vapor-phase etching, the photoresist is removed with oxygen plasma.

Figure 2:
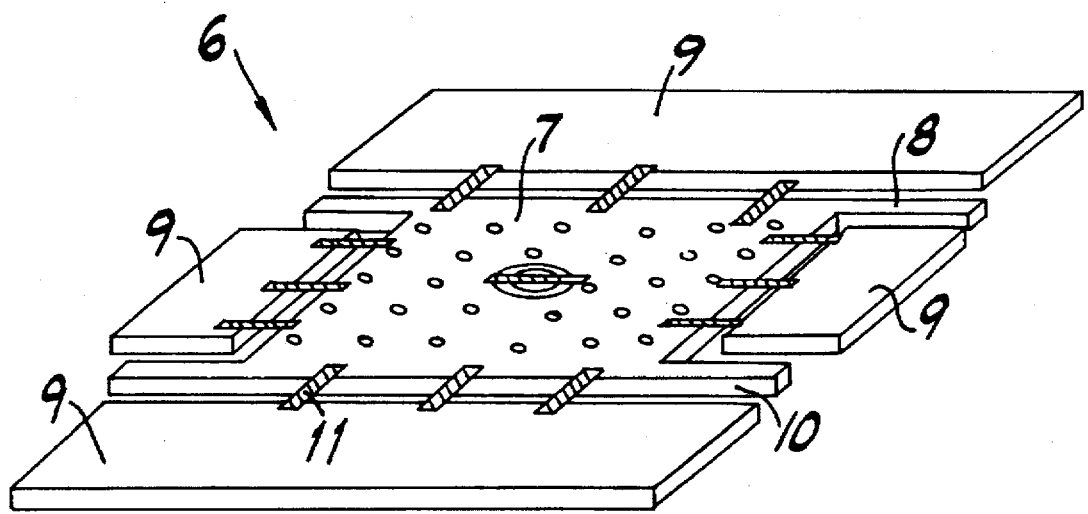
FIG. 2 shows a top view of a micromechanical structure with mechanical reinforcements, according to the present invention.

FIG. 2 depicts a relatively large structure 6 to be exposed, representing a measuring element of an acceleration sensor. The structure 6 essentially consists of a mass represented by a slab 7 which at the corners is linked to the silicon substrate 9 as a support via four shanks 8 and as a result is suspended mechanically in a highly flexible manner. In the state shown, the slab 7 with its shanks 8 has been exposed by etching, via etching grooves 10, in its lateral demarcation. The purpose of the now following vapor-phase etching process corresponding to FIG. 1 is to remove the sacrificial layer (not depicted explicitly) of silicon oxide underneath the slab 7.

Owing to the mechanically very flexible suspension, even minute forces in the course of exposing by etching may cause a deflection of the mass or slab 7 and lead to irreversible adhesion. To counteract this, the vapor-phase etching process is preceded by the application of stiffeners of photoresist between the structure or slab 7 to be exposed and the support of silicon substrate 9. These stiffeners 11 may be applied at the edge or indeed in the center of the mass in question in any number required and prevent deflection and thus adhesion during the etching operation. In the process, the etching resistance of photoresists with respect to the etching medium employed is utilized, so that the mass or slab 7 in question is provided with temporary stiffener.

These stiffeners of photoresist are expediently applied together with a photoresist protective film for electronic circuits. After exposing by etching, the photoresist, i.e. if appropriate a protective film and the stiffeners, is removed by means of oxygen plasma and as a result the structures are freed.

By means of the process described, a sacrificial layer of undoped silicon oxide can be entirely removed. With a pressure in the mtorr range this method is also suitable for etching PSG (phosphosilicate glasses). Materials employed for sacrificial layers however also include doped oxides (boro- or phosphosilicate glass) or silicon nitrides. If etching takes place in liquid media, such doped sacrificial layers can be etched without leaving any residues. In the case of the vapor-phase etching process according to the present invention, however, constituents of the sacrificial layers, e.g. dopants, build up on the silicon substrate surface and leave behind films or particles which, while being water soluble, cannot be removed in the present dry process without abandoning the advantages of the latter. Consequently, etching of these doped sacrificial layers in the vapor phase is not feasible in practice. Nevertheless, the advantages of the method according to the present invention can be utilized even in this case. To this end, stiffeners 11 are likewise applied to the structure 6, as shown, for example, in FIG. 2. These stiffeners are in this case made from a material which etches slowly, compared with the sacrificial layer to be removed. To expose the structures by etching, a two-stage etching process is carried out: first of all, the sacrificial layer is removed without leaving any residues, in accordance with the known methods, in an etching fluid. In the process, the stiffeners 11 etching more slowly are still largely preserved, which prevents the structure or slab 7 to be exposed from being deflected and adhering. Owing to immobilization and fixing via the stiffeners 11, the structures can be subjected to a relatively large force without negative implications, thus permitting drying of the silicon wafer by simple spinning. Laborious sublimation processes or chemical methods for drying can be dispensed with. This is followed by the stiffeners 11 being removed in a dry vapor-phase etching process according to the present invention, and the structures are thus exposed.

Figure 3:
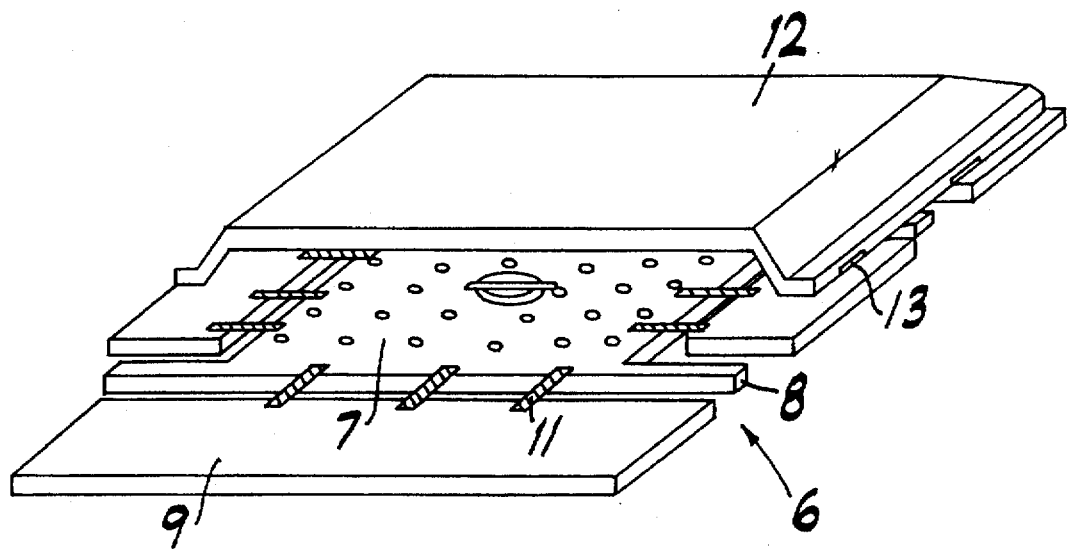
FIG. 3 shows a micromechanical structure with an enclosure, according to the present invention.

FIG. 3 depicts a similar design of a structure 6 as in FIG. 2, so that identical reference symbols are used for identical parts. Here again a mass representing a slab 7 of an acceleration sensor is suspended relatively flexibly, via shanks 8, from a surrounding silicon substrate 9, stiffeners 11 having been applied as bridges below the slab 7, prior to vapor-phase etching of the sacrificial layer. Additionally, the structure 6 is enclosed by a cover 12 made of polysilicon. Disposed on the lateral contact surfaces of the cover 12 there are etching orifices 13 as passages to the structure 6.

In this enclosed embodiment it is not possible to use photoresist for the stiffeners 11, as the photoresist cannot, on the grounds of temperature, have a second polysilicon layer deposited there onto as a cover 2. Instead of photoresist, therefore, a material is employed which etches slowly and without leaving any residues in vapor-phase etching and which is compatible with LPCVD depositions (Low Pressure Chemical Vapor Deposition). This material likewise serves for temporary stiffening and etches more slowly than the material of the sacrificial layer. A possible suitable material for these temporary stiffeners 11 in this case is a thin polysilicon layer, whose etching selectivity with respect to the silicon oxide of the sacrificial layer can be adjusted systematically by oxygen implantation.

For the purpose of exposing by etching, the etching medium penetrates through the etching orifices 13 toward the structure 6 into the interior space created. In a first etching stage, the sacrificial layer is first removed entirely, the stiffeners 11 being attacked only in part and retaining their bracing function, so that the mass or slab 7 to be exposed is fixed in its position, and adhesion to the support is prevented. In a second etching stage, the stiffeners 11 are then removed by continued etching, as a result of which the structure or slab 7 is freed. Then the chamber arrangement can be closed by the deposition of a further layer, and the wafer can be processed further or cut up. An enclosed arrangement is advantageous if the wafer is cut up on a standard saw, since it is then not possible for cooling fluid and fine swarf produced by sawing to penetrate under the exposed structures.

Another possibility of circumventing these problems during sawing and separation of micromechanical elements is that of interchanging the normal sequence of sacrificial layer etching and sawing. Since the method according to the present invention employing vapor-phase etching does not, in contrast to the known processes involving liquid etching, require any process steps at the wafer level, sacrificial layer etching can also be carried out at the chip level after cutting up. Cutting is expediently carried out on a sawing film having an adhesive coating. In order to protect the patterned but not yet exposed micromechanical structures, the surface can be protected from the fine swarf produced by sawing by a special film. After the upper film has been removed, the individual chips on the sawing film are exposed to the etching medium in the vapor-phase etching process, and the sacrificial layer is removed. Any integrated circuits present are again protected by photoresist.

Figure 4:
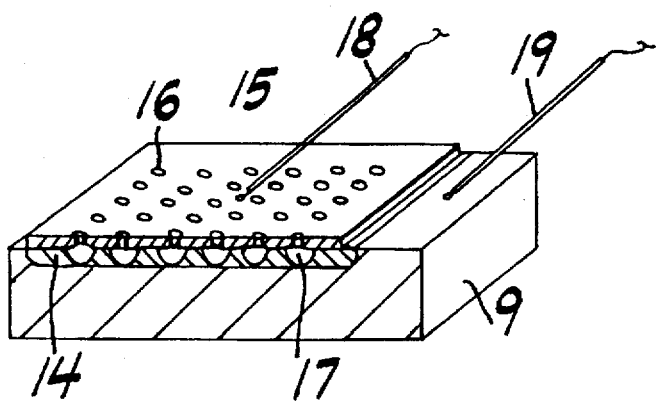
FIG. 4 shows a test structure for in situ etching rate check, according to the present invention.

FIG. 4 depicts a test structure which is additionally located on the silicon wafer, for use as an in situ etching rate check, for control purposes and detecting the etching end point. To this end, a region of the sacrificial layer 14 is demarcated on the silicon substrate 9 and is covered by the second layer 15 of deposited polysilicon. The layer 15 contains rows of holes 16, the holes extending as far as the sacrificial layer 14. The illustration according to FIG. 4 shows a situation in an already advanced etching stage, at which etching medium in the vapor-phase etching process has penetrated through the rows of holes 16 to the sacrificial layer 14 and, in each case, underneath a hole has already etched out a trough-shaped depression 17.

Positioned on the silicon substrate 9 and on the second layer 15 there are contact tips 18, 19 for a capacitance measurement.

The function of the in situ etching rate check by means of the test structure is explained below in conjunction with FIG. 5: since the etching rate of the sacrificial layer is affected by external factors such as the adsorption of water at the surface, precise control can most advantageously be effected by an in situ check. Since in the case of the vapor-phase etching process according to the present invention the etching medium is electrically nonconductive, it is possible, in contrast to conventional methods employing liquid etching media, for electric contact to be made with the wafer by means of the contact tips 18, 19. The silicon substrate 9 and the second layer 15 of polysilicon form the capacitor plates of a capacitor. At the start of the etching operation the gap between the capacitor plates is completely filled with the sacrificial layer forming the dielectric. The silicon oxide of the sacrificial layer is progressively etched in the course of the etching operation and is replaced by air, corresponding to the depiction in FIG. 5. As a result, the effective relative dielectric constant drops from 3.85 ($C_{ox}$ for silicon oxide) to 1 ($C_{air}$ for air). Etching progress can therefore be monitored via the change in the capacitive signal tapped off via the contact tips 18, 19.

Figure 5:
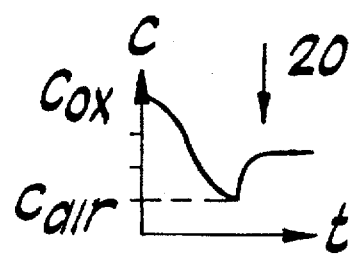
FIG. 5 shows a graph of test structure capacitance as a function of time, according to the present invention.

Given a constant etching rate, the measured capacitance for standard arrangements first decreases as a quadratic function of time and then, when etching fronts overlap, develops into saturation, overall resulting in the S-shaped course over the time axis depicted in FIG. 5. Enrichment and depletion of water at the surface manifest themselves by a deviation from such an S-shaped nominal curve and can be compensated for, in a control loop, by a change in the heat output of the heater 5. Thus it is possible for the etching operation to be carried out in a safe operating range which prevents critical conditions, for example resulting from the formation of a water film on the surface.

After the sacrificial layer 14 has been completely removed, the layer 15 is compressed under the pressure of the contact tip 18 placed onto it and as a result comes to lie against the silicon substrate 9. This is indicated by an abrupt increase in the capacitance signal or by a short circuit, as is shown in FIG. 5. This defines the end point of the etching operation, corresponding to the arrow 20. Such an in situ measurement of the etching rate makes it possible to avoid insufficient and excessive etching and critical operating ranges and to control the etching rate over wide ranges.

What is claimed is:

1. A method for fabricating, on a silicon wafer, at least one micromechanical structure which is at least partially freestanding above a silicon substrate at a distance that is approximately equal to a thickness of a sacrificial layer and is at least partially mounted to the silicon substrate, comprising the steps of:

(a) depositing the sacrificial layer on the silicon substrate;

(b) depositing a second layer on the sacrificial layer, the second layer being patterned;

(c) performing a vapor-phase etching process including the steps of removing, in an etching operation, the sacrificial layer without removing the second layer by subjecting the silicon wafer to a vapor phase of a mixture, of hydrofluoric acid and water to expose the micromechanical structure, and heating the silicon wafer to adjust an etching rate by controlling the water content on a surface of the silicon wafer.

2. The method according to claim 11, wherein the silicon wafer is arranged above a vessel which contains an azeotropic hydrofluoric acid solution, of approximately 38.26%, and the surface of the silicon wafer containing the sacrificial layer and second layer faces an interior of the vessel.

3. The method according to claim 1, wherein the vapor-phase etching process further includes the step of preventing condensation by pumping.

4. The method according to claim 1, wherein the second layer includes polysilicon and the sacrificial layer includes undoped silicon oxide, and wherein the sacrificial layer is removed without subsequent rinsing and drying.

5. The method as claimed in claim 4, further comprising the steps of covering at least one additional electronic circuit disposed on the silicon wafer with a protective film prior to performing the vapor-phase etching process, and removing the protective film after the vapor-phase etching process is completed.

6. The method according to claim 4, further comprising the steps of:

producing stiffeners of photoresist as bridges between the micromechanical structure and the silicon substrate prior to performing the vapor-phase etching process;

exposing the micromechanical structure by removing the sacrificial layer during the vapor-phase etching process, the micromechanical structure being stabilized by the stiffeners;

removing the stiffeners using oxygen plasma after the vapor-phase etching process is completed.

7. The method according to claim 4, further comprising the steps of:

producing stiffeners of a material which etches slowly and without leaving any residues in the vapor phase and is compatible with LPCVD depositions as bridges between the micromechanical structure and the silicon substrate prior to performing the vapor-phase etching process;

disposing a layer as an enclosure having a plurality of etching orifices prior to performing the vapor-phase etching process;

performing the vapor-phase etching process such that the stiffeners are attacked only in part while the sacrificial layer is dissolved, by performing a second etching step to remove the stiffeners;

depositing a second layer closing the enclosure;

cutting the wafer.

8. The method according to claim 7, wherein the stiffeners include a thin polysilicon layer whose etching selectivity with respect to the sacrificial layer of silicon oxide is adjusted systematically by oxygen implantation.

9. The method according to claim 4, further comprising the step of cutting the silicon wafer into individual chips prior to performing the vapor-phase etching process, and performing the vapor-phase etching process on each of the individual chips.

10. The method according to claim 4, further comprising the steps of:

disposing a test structure in the form of a capacitor including the second layer as one capacitor plate, the silicon substrate as a second capacitor plate, and the sacrificial layer as a dielectric situated between the second layer and the silicon substrate, and having a first contact tip contacting the second layer and having a second contact tip contacting the silicon substrate;

monitoring the capacitance of the test structure during the vapor-phase etching process for variation caused by replacing the sacrificial layer with air.

11. The method according to claim 10, further comprising the step of monitoring the capacitance for a short-circuit or abrupt increase in capacitance signal, indicating an end of the etching process, caused by compressing the test structure due to dissolvement of the sacrificial layer.

12. The method according to claim 1, wherein the second layer includes polysilicon, and the sacrificial layer includes doped silicon oxide, and further comprising the steps of producing a plurality of stiffeners including a slow-etching material including polysilicon with implanted oxygen as bridges between the micromechanical structures to be produced and the silicon substrate prior to performing an etching process, performing a first etching step in a liquid phase of an etching medium where the sacrificial layer is removed completely and the plurality of stiffeners being dissolved only in part and continuing to perform a stiffening function, rinsing and drying the silicon wafer by spinning, and performing a second etching step using the vapor-phase etching process to remove the plurality of stiffeners.

* * * * *

UNITED STATES PATENT AND TRADEMARK OFFICE
CERTIFICATE OF CORRECTION

PATENT No. : 5,683,591

DATED : November 4, 1997

INVENTOR(S): Offenberg, Michael

It is certified that error appears in the above-identified patent and that said Letters Patent is hereby corrected as shown below:

Column 6, line 37, after "mixture" delete " , "; and

Column 6, line 41, "11" should be --1--.

Signed and Sealed this

Third Day of August, 1999

Attest:

Q. TODD DICKINSON

*Attesting Officer*  *Acting Commissioner of Patents and Trademarks*